United States Patent
Kriz et al.

(10) Patent No.: US 10,749,539 B2
(45) Date of Patent: Aug. 18, 2020

(54) APPARATUS AND METHOD FOR A VAPOR CELL ATOMIC FREQUENCY REFERENCE

(71) Applicant: Honeywell International Inc., Morris Plains, NJ (US)

(72) Inventors: Jeffrey James Kriz, Eden Prairie, MN (US); Robert Compton, Loretto, MN (US)

(73) Assignee: Honeywell International Inc., Morris Plains, NJ (US)

( * ) Notice: Subject to any disclaimer, the term of this patent is extended or adjusted under 35 U.S.C. 154(b) by 164 days.

(21) Appl. No.: 16/031,458

(22) Filed: Jul. 10, 2018

(65) Prior Publication Data

US 2019/0296754 A1    Sep. 26, 2019

Related U.S. Application Data (60) Provisional application No. 62/648,079, filed on Mar. 26, 2018.

(51) Int. Cl.
*H03L 7/26*   (2006.01)
*H03B 17/00*   (2006.01)
(Continued)

(52) U.S. Cl.
CPC .............. *H03L 7/26* (2013.01); *G04F 5/14* (2013.01); *G04F 5/145* (2013.01); *H03B 17/00* (2013.01);
(Continued)

(58) Field of Classification Search
CPC ......... G04F 5/14; G04F 5/145; B81B 3/0081; B81B 7/0006; B81B 7/0012; H01S 1/02;
(Continued)

(56) References Cited

U.S. PATENT DOCUMENTS 7,379,486 B2    5/2008   Lust et al.
7,944,317 B2    5/2011   Strabley et al.
(Continued)

FOREIGN PATENT DOCUMENTS

CN    107193204 A    9/2017
WO    9712298 A1    4/1997

OTHER PUBLICATIONS

Brannon et al., "A Low-Power, Low Phase Noise Local Oscillator for Chip-Scale Atomic Clocks", 2005, pp. 1535-1538, IEEE.
(Continued)

*Primary Examiner* — Arnold M Kinkead
(74) *Attorney, Agent, or Firm* — Fogg & Powers LLC (57) ABSTRACT

A chip scale atomic clock (CSAC) includes a temperature stabilized physics system and a temperature stabilized electronics circuitry electrically coupled to the temperature stabilized physics system. Atomic clocks utilize an optical signal having a frequency component. The temperature stabilization increases frequency stability. The temperature stabilized physics system includes a vapor cell and a magnetic field coil, and is enclosed in a magnetic shield. When an ambient temperature of a chip scale atomic clock increases, fluid is extended away, due to thermal expansion, from at least one reservoir towards or away from a thermally isolated subsystem in at least one of the temperature stabilized electronics circuitry and the temperature stabilized physics system.

20 Claims, 7 Drawing Sheets

(51) Int. Cl.
*H03L 1/04* (2006.01)
*G04F 5/14* (2006.01)
*H01S 5/022* (2006.01)
*H01S 5/024* (2006.01)
*H01S 5/183* (2006.01)

(52) U.S. Cl.
CPC ............ *H03L 1/04* (2013.01); *H01S 5/02208* (2013.01); *H01S 5/02248* (2013.01); *H01S 5/02469* (2013.01); *H01S 5/183* (2013.01)

(58) Field of Classification Search
CPC .... H01S 1/06; H01S 5/02208; H01S 5/02248; H01S 5/02469; H01S 5/183; H01L 2924/0002; H01L 2924/00; H03L 7/26; H03L 1/04; H03B 17/00
USPC ............ 331/3, 94.1; 428/116, 161, 164, 138
See application file for complete search history.

(56) References Cited

U.S. PATENT DOCUMENTS

| | | | |
|---|---|---|---|
| 7,965,147 | B2 | 6/2011 | Strabley et al. |
| 8,067,991 | B2 | 11/2011 | Youngner et al. |
| 8,218,590 | B2 | 7/2012 | Youngner et al. |
| 8,242,851 | B2 | 8/2012 | Youngner et al. |
| 8,299,860 | B2 | 10/2012 | Youngner et al. |
| 8,624,682 | B2 | 1/2014 | Ridley et al. |
| 8,669,823 | B1 | 3/2014 | Olsson et al. |
| 8,756,976 | B2 | 6/2014 | Schober et al. |
| 8,941,442 | B2 | 1/2015 | Youngner et al. |
| 9,077,354 | B2 | 7/2015 | Strabley et al. |
| 9,083,363 | B2 | 7/2015 | Fertig et al. |
| 9,146,540 | B2 | 9/2015 | Youngner et al. |
| 9,164,491 | B2 | 10/2015 | Ridley et al. |
| 9,285,249 | B2 | 3/2016 | Schober et al. |
| 9,312,869 | B2 | 4/2016 | Kriz et al. |
| 9,417,261 | B2 | 8/2016 | Salit et al. |
| 9,685,909 | B2 | 6/2017 | Gan |
| 9,837,177 | B1 | 12/2017 | Roper et al. |
| 2008/0203081 | A1 | 8/2008 | Eickhoff et al. |
| 2011/0187465 | A1 | 8/2011 | Youngner et al. |
| 2012/0286884 | A1* | 11/2012 | DeNatale ................ B05D 3/10 331/94.1 |

OTHER PUBLICATIONS

Braun et al., "RF-Interrogated End-State Chip-Scale Atomic Clock", 39th Annual Precise Time and Time Interval (PTTI) Meeting, Nov. 2007, pp. 233-248.

Chutani et al., "Thermal management of fully LTCC-packaged Cs vapour cell for MEMS atomic clock", Sensors and Actuators A: Physical, 2012, pp. 58-68, Elsevier.

European Patent Office, "Extended European Search Report from EP Application No. 19164758.5 dated Jul. 26, 2019", from Foreign Counterpart to U.S. Appl. No. 16/031,458, pp. 1-11, Published: EP.

Zhao et al., "Chip Scale Atomic Resonator Frequency Stabilization System With Ultra-Low Power Consumption for Optoelectronic Oscillators", IEEE Transactions on Ultrasonics, Ferroelectrics, and Frequency Control, Jul. 2016, pp. 1022-1027, vol. 63, No. 7, IEEE.

Fernandez et al, "CSAC Characterization and Its Impact on GNSS Clock Augmentation Performance", "Sensors 2017,17,370", "www.mdpi.com/journal/sensors", Published Feb. 14, 2017, pp. 1-19, Publisher: MDPI.

\* cited by examiner

APPARATUS AND METHOD FOR A VAPOR CELL ATOMIC FREQUENCY REFERENCE

CROSS-REFERENCE TO RELATED APPLICATIONS

The present application claims benefit of U.S. Patent Application Ser. No. 62/648,079, filed Mar. 26, 2018; the entire content of the aforementioned patent application is incorporated herein by reference as if set forth in its entirety.

BACKGROUND

Chip scale atomic clocks using atomic vapor cells (CSACs) provide up to four orders of magnitude better accuracy as a frequency reference than temperature-controlled oscillators (TCXOs). CSACs are cheaper and smaller but are less accurate frequency references than cold atom based clocks. There is a desire to increase the stability of CSACs over temperature, thus extending the period of time required between synchronizations with a primary frequency reference.

SUMMARY

A chip scale atomic clock (CSAC) is provided. The CSAC comprises: a temperature stabilized physics system, comprising a vapor cell and a magnetic field coil, and which is enclosed in a magnetic shield; and a temperature stabilized electronics circuitry electrically coupled to the temperature stabilized physics system.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

In the following detailed description, reference is made to the accompanying drawings that form a part hereof, and in which is shown by way of illustration specific illustrative embodiments. However, it is to be understood that other embodiments may be utilized and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

Atomic clocks rely on an optical signal having a frequency component that causes electrons of the atom to be stimulated to a higher energy level. Chip scale atomic clocks using vapor cells (CSACs) include (a) a physics package or system, and (b) electronic circuitry to (i) control and/or (ii) process data sent to and/or received by components of the physics system. The physics system may be temperature stabilized to diminish temperature variations of physics system components to diminish variations in frequency, thus enhancing frequency stability; thus, the physics system may also be referred to as a temperature stabilized physics system. However, the electronic circuitry may not temperature stabilized, which results in a CSAC becoming less accurate in an environment when the ambient temperature varies. To further enhance frequency stability, all or part of the electronic circuitry can be temperature stabilized to diminish temperature variation of electronic circuitry components to further diminish variations in frequency, thus further enhancing frequency stability.

Figure 1:
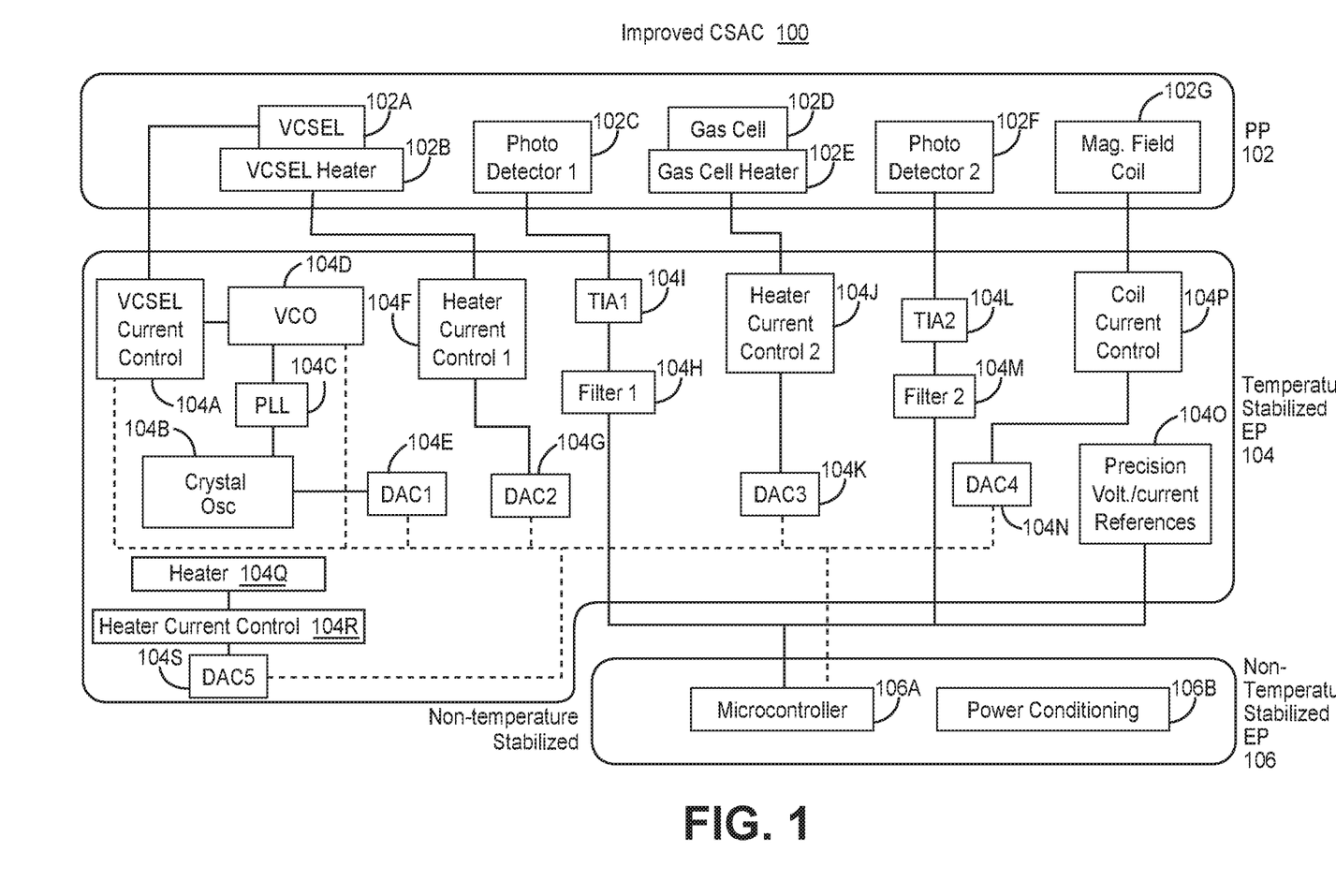
FIG. 1 illustrates a block diagram of one embodiment of a chip scale atomic clock including a temperature stabilized electronics circuitry.

FIG. 1 illustrates a block diagram of one embodiment of a chip scale atomic clock including a temperature stabilized electronics circuitry (improved C SAC) 100. The improved CSAC 100 includes a temperature stabilized physics package or system (physics package or PP) 102 and a temperature stabilized electronic circuitry (temperature stabilized electronics circuitry (EP)) 104. Optionally, the improved CSAC 100 includes non-temperature stabilized electronic circuitry (temperature stabilized electronics circuitry (EP)) 106.

The temperature stabilized physics system 102 is a system, including a gas cell 102D, an optical source (e.g. a LASER), at least one photodetector (e.g. photo detector 1 102C and photo detector 2 102F) and a magnetic field coil, (exemplified below) having all or some of its components maintained at a substantially constant set point temperature, e.g. about 90° C., over a wide range of external, ambient temperatures (e.g. −40° C. to 85° C.). The substantially constant set point temperature means a temperature with in a range of temperatures that does not decrease the stability of the CSAC. Thus, the substantially constant set point temperature is larger than the ambient temperature. In part, this may be accomplished by thermally isolating such all or some components from the external environment and providing additional heat energy to maintain the desired elevated set point temperature. To accomplish this, the temperature stabilized physics system 102 includes at least one heater, e.g. a VSCEL heater and/or a gas sell heater 102E.

The illustrated temperature stabilized physics system 102 includes an optical source that is a LASER. For pedagogical reasons, the LASER will be illustrated as a vertical cavity surface emitting LASER (VCSEL) 102A. However, other types of LASERs such as a horizontal diode LASER may be used. Other components in FIG. 1 may be labelled as VSCEL heater or current control, but this also is for pedagogical purposes; the heater and current control may be used with other types of LASERs. The VCSEL 102A is thermally coupled to a heater (VCSEL heater) 102B and is configured to control and stabilize the temperature of the VCSEL 102A.

Similarly, the gas cell 102D is thermally coupled to a heater (gas cell heater) 102E and is configured to control and stabilize the temperature of the gas cell 102D.

The gas cell 102 typically includes alkali atoms in a vapor state. For example, the alkali is cesium or rubidium. An optical signal emitted from the VCSEL 102A is projected into the gas cell 102D.

One embodiment of a temperature stabilized physics system 102 is illustrated in FIG. 1, however the temperature stabilized physics system 102 can be implemented in other ways with other component types.

In FIG. 1, the solid lines indicate paths for analog electrical signals. The dashed lines indicate paths for digital electronic signals.

The temperature stabilized electronic circuitry 104 is a system including control and signal processing circuitry (exemplified below) whose components are maintained at a substantially constant set point temperature, e.g. 90° C., over a wide range of external, ambient temperatures (e.g. −40° C. to 85° C.). In part, this may be accomplished by thermally isolating all or some components from the external environment.

Optionally, as illustrated in FIG. 1, the improved CSAC 100 includes non-temperature stabilized electronic circuitry (non-temperature stabilized electronics circuitry (EP)) 106. The non-temperature stabilized electronic circuitry 106 may be separated from the temperature stabilized electronic circuitry 104 because the non-temperature stabilized electronic circuitry 106 may:

(a) generate undesirable electrical noise which detrimentally affects the operation of other electrical circuitry;
(b) not rely on precision currents and/or voltages, and therefore is not sensitive to temperature variants;
(c) operate as, or as part of, a closed loop system, and therefore is not sensitive to temperature variations; and/or
(d) be too large by volume or power consumption so that if included in the temperature stabilized electronic circuitry 104, the power consumed by the temperature stabilized electronic circuitry 104 would be excessive (e.g. beyond permitted system operating specifications)
.

Optionally, all, rather than part, of the electronics circuitry is within the temperature stabilized circuitry 104.

The illustrated temperature stabilized physics system 102 also includes a magnetic field coil (mag. field coil) 102G used to facilitate coherent population trapping (CPT). The illustrated temperature stabilized physics system 102 also includes a first photodetector (photo detector 1) 102C and a second photodetector 102F (photo detector 2) which are used to sense an amount of optical power respectively (a) an optical signal emitted from the VCSEL 102A, and (b) a corresponding optical signal output from the gas cell (or vapor cell) 102D. The optical signal emitted from the VCSEL 102A enters, passes through, and is output from the gas cell 102D. The first photodetector 102C and the second photodetector 102F (and their corresponding transimpedance amplifiers and filters) are each part of feedback loops, e.g. used to adjust the frequency of the crystal oscillator, signal amplitudes, and heater current control circuits described herein.

The illustrated temperature stabilized electronics circuitry 104 includes a current control circuit (VCSEL current control) 104A, a crystal oscillator 104B (e.g. a 10 MHz crystal oscillator), a phase lock loop 104C, a voltage controlled oscillator 104D (VCO) (e.g. a 3.417 GHz VCO), a first digital to analog data converter (DAC) (DAC1) 104E, a first heater current control circuit (heater current control 1) 104F, a second DAC (DAC2) 104G, a first filter (filter 1) 104H, a first transimpedance amplifier (TIA) (TIA1) 104I, second heater current control circuit (heater current control 2) 104J, a third DAC (DAC3) 104K, a second TIA (TIA2) 104L, a second filter (filter 2) 104M, a fourth DAC (DAC4) 104N, precision voltage and/or current reference(s) (precision volt/current references) 104O, a coil current control circuit (coil current control) 104P, a heater 104Q, a heater current control circuit (heater current control) 104R, and a fifth DAC (DAC5) 104S. The precision voltage and/or current reference(s) 104O may be electrically coupled to one or more components of the temperature stabilized physic system 102, the temperature stabilized electronic circuitry 104, and/or the non-temperature stabilized electronic circuitry 106. The DACs illustrated herein covert digital signals, e.g. sent from the microcontroller to analog controlled component(s), to analog signals.

The VCSEL current control circuit 104A is configured to control the frequency of the VCSEL 102A. The VCSEL current control circuit 104A is configured to be coupled to the VCO 104D of a phase locked frequency source, and a microcontroller 106A, one or both of which are optionally located in the non-temperature stabilized electronics circuitry 106. For purposes of clarity, the microcontroller described herein may be one or more of the following: microcontroller circuitry, central processing unit circuitry, digital signal processing circuitry, and/or application specific integrated circuitry. The microcontroller may also be referred to herein as controller circuitry.

A frequency of the optical signal generated by the VCSEL 102A is controlled by the microcontroller 106A. The phase locked frequency source comprises the VCO 104D, the phase locked loop (PLL) 104C, and the crystal oscillator 104B. The VCO 104D is coupled to the PLL 104C and is configured to be coupled to the microcontroller 106A for altering frequency counter settings to adjust the output frequency of the VCO 104D. The crystal oscillator 104B is coupled to the PLL 104C and is configured to be coupled to a first DAC 104E; the first DAC 104E is configured to be coupled to the microcontroller 106A to allow fine control and correction of the crystal oscillator frequency 104B.

The set point current and temperature of the VSCEL 102A are used to control the carrier frequency of the optical signal emitted by the VSCEL 102A. The microwave output signal generated by phase locked frequency source is summed with a DC current. Both the DC current and the microwave output signal are provided to the VCSEL 102. The microwave output signal frequency modulates the optical output of the VCSEL 102, thus creating sidebands at frequencies matching a resonant frequency of the alkali atoms.

The first heater current control circuit 104F is configured to be coupled to the VCSEL heater 102B and the second DAC 104G; the second DAC 104G is configured to be coupled to the microcontroller 106A. Thus, the temperature of the VCSEL 102A is regulated by the microcontroller 106A.

The photodetectors described herein convert incident optical power to an electrical current signal; the current level is proportional to the incident optical power level. The first TIA 104I is configured to be coupled to the first photodetector 102C and the first filter 104H; the first filter 104H is configured to be coupled to the microcontroller 106A. The first TIA 104I converts the current output of the first photodetector 102C from a current signal to a voltage signal. The first filter 104H filters, e.g., isolates and amplifies recovered stimulus signals produced by microcontroller 106A, and provides the filtered voltage signal to the microcontroller 106A for coherent demodulation.

The first filter 104H is configured to be coupled to the microcontroller 106A, and to provide the filtered voltage signal to the microcontroller 106A for coherent demodulation. The current level and voltage level correspond to the optical power incident upon the first photodetector 102C.

The second heater current control circuit 104J is configured to be coupled to the gas cell heater 102E and the third DAC 104K; the third DAC 104G is configured to be coupled to the microcontroller 106A. The third DAC 104K converts digital signals from the microcontroller 106A to analog signals which the heater current control circuit 104J is configured to receive; the analog signals control the current generated by the heater current control circuit 104J, and as a result the thermal energy of the gas cell heater 102E. Thus, the temperature of the gas cell 102D is regulated by the microcontroller 106A in conjunction with a temperature sensitive resistor based servo control circuit driving the gas cell heater 102E.

The second TIA 104L is configured to be coupled to the second photodetector 102E and the second filter 104M; the second filter 104H is configured to be coupled to the microcontroller 106A. The second TIA 104L converts the current output of the second photodetector 102F from a current signal to a voltage signal. The second filter 104H filters, e.g., isolates and amplifies multiple recovered stimulus signals produced by microcontroller 106A and provides the filtered voltage signal to the microcontroller 106A for coherent demodulation of the multiple stimulus signals. The current level and voltage level correspond to the optical power incident upon the second photodetector 102F.

The coil current control circuit 104P is configured to control the current flowing through the magnetic field coil 102G. The coil current control circuit 104P is configured to be coupled to the fourth DAC 104N. The fourth DAC 104K is configured to be coupled to the microcontroller 106A. The fourth DAC 104K converts digital signals from the microcontroller 106A to analog signals which the coil current control circuit 104P is configured to receive; the analog signals control the current generated by the coil current control circuit 104P, and as a result the magnetic field energy generated by the magnetic field coil 102G. Thus, the current flowing through the magnetic field coil 102G is controlled by the microcontroller 106A.

The temperature stabilized electronics circuitry also includes at least one EP heater 104Q, at least one EP heater current control circuit (EP heater current control) 104R, and/or at least one fifth DAC (DAC5 or fifth DAC) 104S. The EP heater 104Q is thermally coupled to all or some of the components in the temperature stabilized electronics circuitry, and is configured to control and stabilize the temperature of such all or some components.

In the illustrated embodiment, the EP heater 104Q is coupled to the EP heater control circuit 104R. Optionally, the EP heater 104Q may be at least one resistive heater implemented in at least one tether and/or a second substrate. Optionally, the EP heater control circuit 104R is implemented with a Wheatstone bridge in a second substrate. Tethers and second substrates are further described below.

The EP heater control circuit 104R is coupled to the fifth DAC 104S. The fifth DAC 104S is configured to be coupled to the microcontroller 106A. The fifth DAC 104S converts digital signals from the microcontroller 106A to analog signals which the EP heater current control circuit 104R is configured to receive; the analog signals control the current generated by the EP heater current control circuit 104R, and as a result the thermal energy generated by the EP heater. Thus, the temperature of the temperature stabilized electronics circuitry 104 is controlled by the microcontroller 106A.

The microcontroller 106A has analog and/or digital inputs and/or outputs. In one embodiment, analog signals to and/or from the first filter 104A, the second filter 104M, and/or the precision voltage and/or current reference(s) 104O are electrically coupled respectively to the analog inputs and/or outputs of the microcontroller 106A. In another embodiment, digital signals to and/or from the VCSEL current control circuit 104A, the VCO 104D, the first DAC 104E, the second DAC 104G, the third DAC 104K, the fourth DAC 104N, and/or the fifth DAC 104S are electrically coupled respectively to the digital inputs and/or outputs of the microcontroller 106A. Optionally, the microcontroller 106A only has digital inputs and/or outputs, and the analog signals coupled to and/or from the microcontroller are converted to digital signals by one or more analog to digital converters.

The non-temperature stabilized electronics circuitry 106 may include other circuitry, such as the illustrated power conditioning circuitry 106B. The power conditioning circuitry 106 may include one or more low drop out regulators, DC-DC voltage regulators, non-critical voltage references (e.g. band gap voltage references), and/or non-critical current references (e.g. constant current sources). The power conditioning circuitry 106B may be coupled to, and provides power to, one or more components in the temperature stabilized physics system 102, the temperature stabilized electronics circuitry 104, and/or the non-temperature stabilized electronics circuitry 106.

The non-temperature stabilized electronics circuitry 106 may include the microcontroller 106A if that component is not in the temperature stabilized electronics circuitry. To reduce the volume and/or power consumption (e.g. of heaters) of the temperature stabilized electronics circuitry 104, some of the aforementioned components of the temperature stabilized electronics circuitry 104 can be included in the non-temperature stabilized electronics circuitry 106. Optionally, the non-temperature stabilized electronics circuitry 106 (and not the temperature stabilized temperature system 104) may include the crystal oscillator 104B, PLL 104C, the first heater current control circuit 104F, the second heater current control circuit 104J, and/or the coil current control circuit 104P because those components are either implemented with feedback, e.g. from the first photodetector 102C and/or the second photodetector 102F, making them less susceptible to temperature variations or are part of a system including a feedback mechanism that makes them less susceptible to temperature variations. Further, optionally, the non-temperature stabilized electronics circuitry 106 may include the first DAC 104E, the second DAC 104G, the third DAC 104K, the fourth DAC 104N, the fifth DAC 104S, the first filter 104H, and/or the second filter 104M if those components are implemented in a manner so that their operational parameters are relatively temperature invariant. For example, the first filter 104H and/or the second filter 104M may be implemented as active filters which are less susceptible to temperature variations if designed with passive components having low temperature coefficients with respect to their fundamental passive component parameters (e.g. resistance for a resistor, capacitance for a capacitor, and inductance for an inductor). Optionally, if a filter is implemented by an active filter, non-temperature compensated passive components can be implemented in the temperature stabilized electronics circuitry 104, while the active component(s), e.g. an operational amplifier because of its feedback architecture has parameters which are relatively temperature invariant due to its closed loop implementation, can be included in the non-temperature stabilized electronics circuitry 106. The DACs may be implemented using external temperature compensated voltage references, and/or with pulse width modulators and/or integrators that are temperature invariant.

Figure 2:
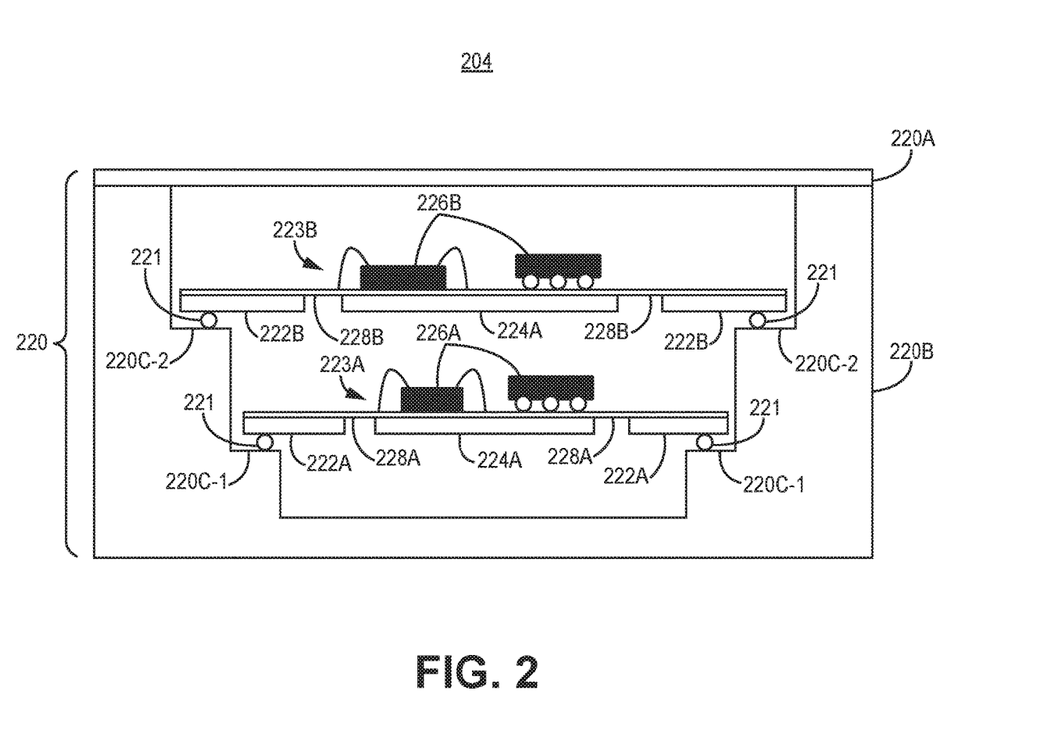
FIG. 2 illustrates one embodiment of a temperature stabilized electronics circuitry.

FIG. 2 illustrates one embodiment of a temperature stabilized electronics circuitry 204. The temperature stabilized electronics circuitry 204 includes at least one electrical system (electrical system(s)) mounted in a package 220. In FIG. 2, a first electrical system 223A and a second electrical system 223B are illustrated.

The illustrated package 220 comprises a lid 220A attached to a body 220B. Optionally, the lid 220A is hermetically sealed 220A to the body 220B; optionally the interior of the package 220 is evacuated and is substantially a vacuum; the vacuum increases the thermal isolation between the components in the package 220, and the package 220 and its external environment. Optionally, the lid 220A and/or the body 220B may be fabricated from a ceramic. Getter materials may be applied to the lid 220A to aid in maintaining near vacuum level pressures over the lifetime of the device. The interior of the body 220B includes at least one set of ledges. The illustrated body 220B includes two sets of ledges 220C-1, 220C-2.

Each electrical system is mounted on a corresponding set of ledges. In FIG. 2, the first electrical system 223A is mounted on a first set of ledges 220C-1, and the second electrical system 223B is mounted on the second set of ledges 220C-2. Each electrical system is attached to a corresponding set of ledges by an adhesive material 221 such as epoxy or solder. The electrical system(s) may be interconnected to one another and/or to external systems (such as the temperature stabilized physics package and/or the non-temperature stabilized electronics circuitry) using conventional packaging techniques, for example incorporating interconnects such as conductive via holes, lead frames, and or solder balls in and/or on the electronics circuitry 204

Each electrical system comprises a first substrate, a second substrate, tethers, and at least one electrical circuit. The first substrate and the second substrate may be made from silicon. Electrical conductors may be formed on each of the first substrate, the second substrate, and/or the tethers may for providing electrical paths for data signals (such as control signals and measured data signals), reference signals (such as reference voltages and/or reference currents) and/or electrical power. The tethers provide electrical coupling and thermal isolation between the first substrate and the second substrate. The tethers may comprise a substrate that is a thermal insulator (which provides thermal isolation) such as polyimide. The conductors may be formed with gold; the conductors facilitate transmission of data and power between a first substrate and a corresponding second substrate.

The at least one electrical circuit may be mechanically attached to the second substrate by solder balls, or another adhesive such as solder film or epoxy. The at least one electrical circuit may be electrically coupled to, e.g. transmission lines, in the second substrate, by solder balls, conductive bond wire, and/or conductive bond ribbon. Alternatively, or additionally, the at least one electrical circuit may be integrated into the second substrate, e.g. by conventional semiconductor processing; such integration eliminates the need for mechanical attachment and external electrical coupling (to facilitate transmission of data and power) between the integrated electrical circuit and, e.g. transmission lines of, the second substrate.

The illustrated first electrical system 223A includes at least one first electrical circuit 226A. The illustrated second electrical system 223B includes at least on second electrical circuit 226B. The electrical circuits can be active and/or passive electrical devices.

The illustrated first electrical system 223A includes a first substrate 222A coupled by first tethers 228A to a second electrical substrate 224A. The illustrated second electrical system 223B includes a second substrate 222B coupled by second tethers 228B to a second electrical substrate 224B.

Figure 3A:
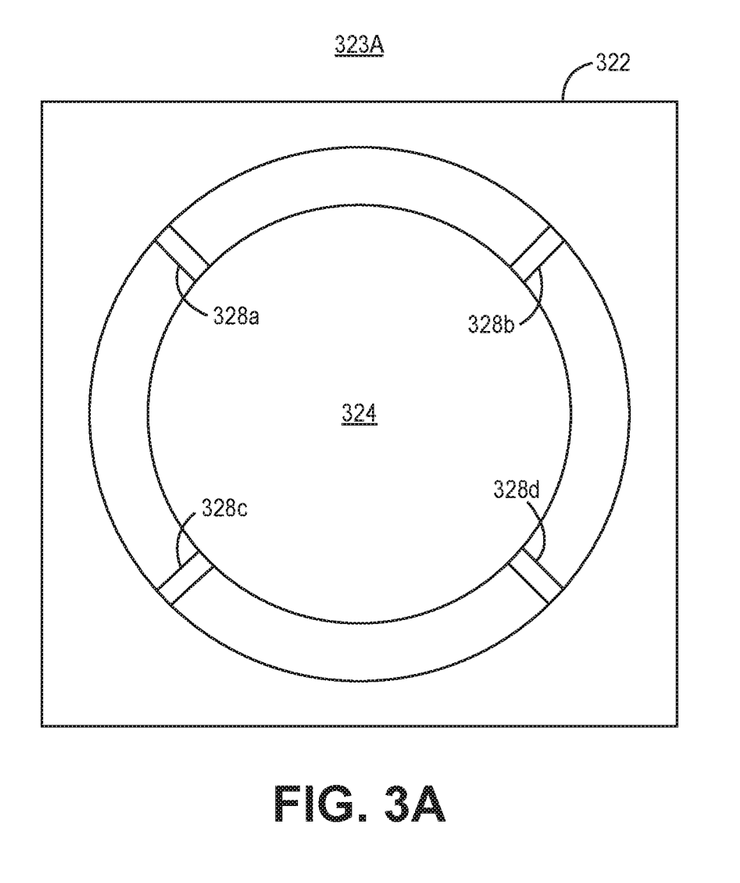
FIG. 3A illustrates a plan view of one embodiment of an electrical system.

FIG. 3A illustrates a plan view of one embodiment of an electrical system 323A. The electrical system 323A comprises a first substrate 322 coupled to a second substrate 324 by tethers 328a, 328b, 328c, 328d. Optionally, two or more tethers can be used to support the second substrate from the first substrate. However, if the second substrate is supported by one or more other support structures, zero, one, or more tethers may be used to mechanically, thermally, and/or electrically couple the first substrate 322 to the second substrate 324. The second substrate 324 is otherwise separated by spaces or voids (e.g. substantially pie shaped regions between two tethers); the spaces provide additional thermal isolation between the first substrate 322 and the second substrate 324.

Figure 3B:
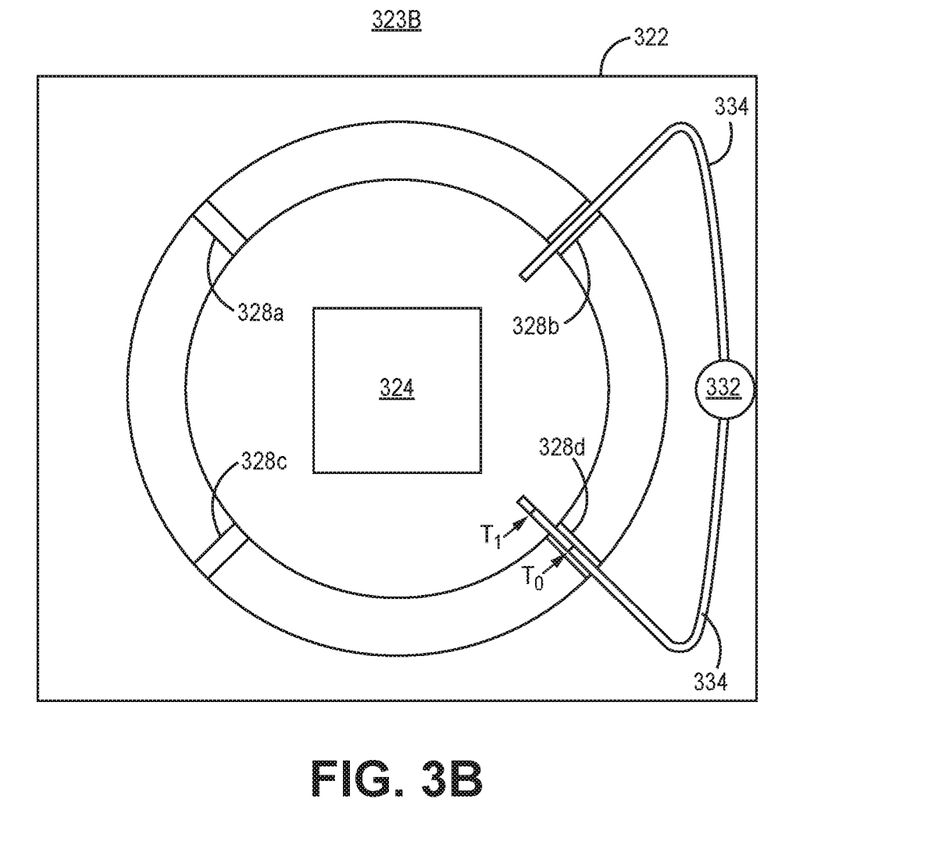
FIG. 3B illustrates a plan view of one embodiment of an electrical system incorporating a heat sink system.

FIG. 3B illustrates a plan view of one embodiment of an electrical system incorporating a heat sink system 323B. The heat sink system 323B facilitates reducing the thermal conductivity between the first substrate 322 and the second substrate 324, and components thereon, so that when the ambient temperature of the improved CSAC 100 increases then the second substrate 324, and the components thereon, can dissipate more thermal energy to the first substrate to facilitate maintaining a constant temperature of the second substrate 324 and the components hereon.

The electrical system incorporating a heat sink system 323B comprises a first substrate 322 coupled to a second substrate 324 by tethers 328a, 328b, 328c, 328d. The heat sink system is used to maintain the electrical circuits on the second substrate 324 at a relatively constant temperature. The subsequently describe heat sink system can also be employed in the temperature stabilized physics system 102 to maintain a relatively constant temperature of electrical circuits, the VCSEL 102A, the gas cell 102D, and any other components on a second substrate in the temperature stabilized physics system 102.

The illustrated heat sink system is a passive heat sink system. The passive heat sink system maintains the substantially constant set point temperature of a temperature stabilized system over a wider range of ambient temperature. As a result, lower cost, more readily available components (which are more susceptible to changes in their operating parameters due to temperature variation) can be used in the temperature stabilized system. Also, the temperature stabilized system can be operated at higher ambient temperatures.

The heat sink system comprises at least one reservoir 332 mounted on or in the first substrate 322 and/or the second substrate 324. For pedagogical purposes, the at least one reservoir 332 will be illustrated as being located in the first substrate 322. At least one microchannel (microchannel(s)) 334, in the first substrate 322 and one or more tethers, are coupled to the at least one reservoir 332. The reservoir, and at least part of the microchannel(s) are filled with a fluid, e.g. a liquid metal for example like mercury or a liquid eutectic alloy for example like Galinstan.

As the ambient temperature of the improved CSAC 100 increases, then the fluid in the microchannels will extend from the first substrate 322 towards the second substrate 324, or visa versa, depending upon in which substrate the reservoir is located. As a result, the thermal isolation between the second substrate 324 and the first substrate 322 is reduced. Thus, the second substrate 322, and the components thereon, can dissipate more thermal energy to the first substrate 322.

Figure 3C:
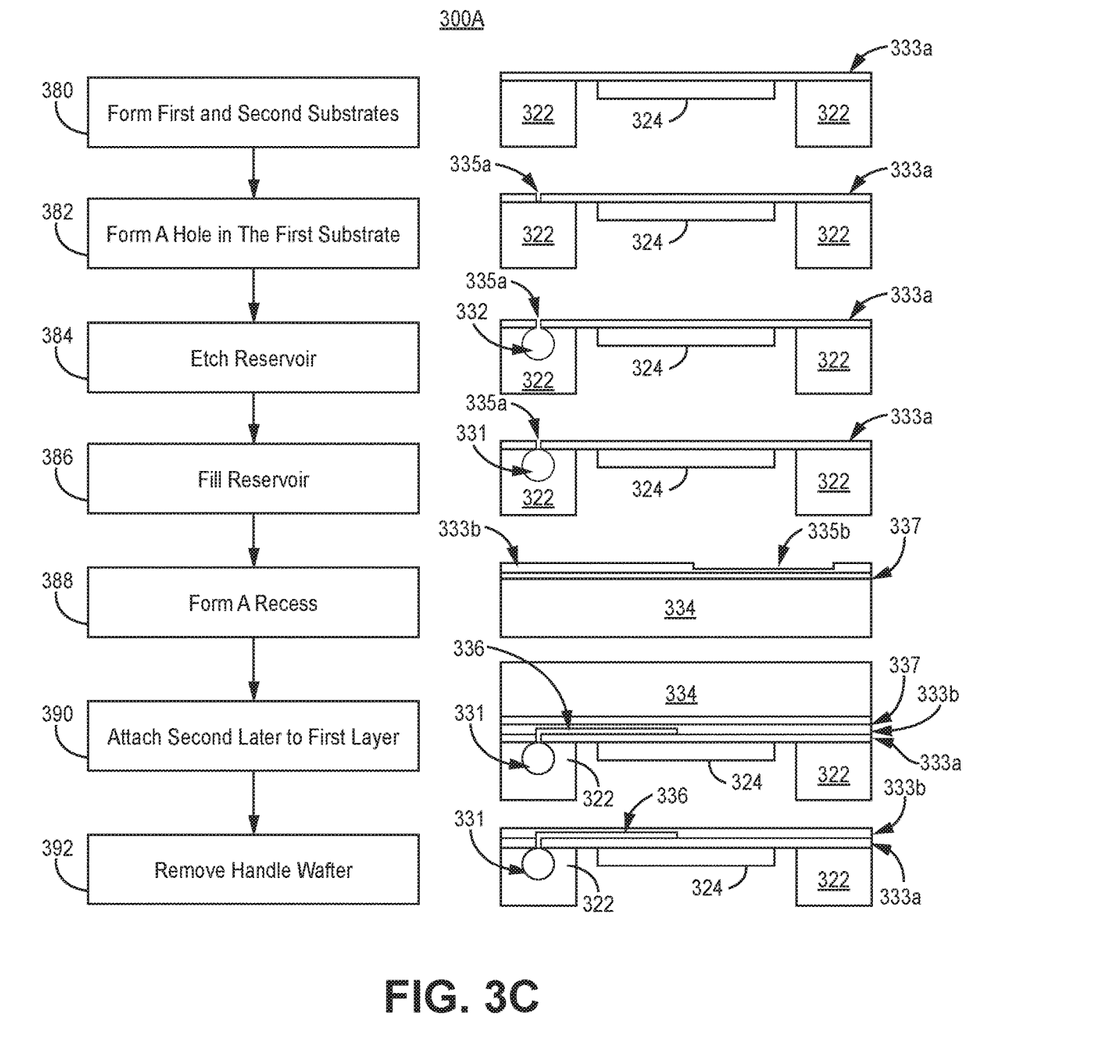
FIG. 3C illustrates an exemplary method of making a temperature stabilized physics system or a temperature stabilized electronics circuitry.

FIG. 3C illustrates an exemplary method 300A of making a temperature stabilized physics system or a temperature stabilized electronics circuitry. To the extent the method 300 shown in FIG. 3C is described herein as being implemented in the system shown in FIGS. 1-3B, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 380, form a first substrate 322 with a first layer 333a on the first substrate 322 and second substrate 324 with the first layer 333a on the second substrate 324 from a single substrate with the first layer 333a on the single substrate. For example, the single substrate is a silicon wafer. The first substrate 322 with the first layer 333a is separated from the second substrate 324 with the first layer 333 by an opening between the first substrate 322 and the second substrate 324. The first layer 333a may be a dielectric, such as polyimide, or other type of material, and may be deposited on the single substrate by conventional deposition techniques. The first substrate 322 and the second substrate 324 may be formed from the single substrate using conventional lithography and etching, e.g. dry etching, techniques.

In block 382, form at least one opening 335a in the first layer 333 over at least one of the first substrate 322 and the second substrate 324. The opening 335a may be formed from the single substrate using conventional lithography and etching, e.g. dry or wet etching, techniques.

In block 384, form a reservoir 332 in the first substrate 322 under each opening 335a. Each reservoir 332 may be formed in a substrate using conventional lithography and etching, e.g. wet etching, techniques.

In block 386, fill each reservoir 332 with a fluid 331, e.g. as described above. In block 388, form at least one recess 335b in a second layer 333b on a handle wafer 334. The second layer 333b may be a dielectric, such as polyimide, or other type of material. The handle wafer 334 may be a substrate, such as a silicon substrate. The recess 335b may be formed from the single substrate using conventional lithography and etching, e.g. dry or wet etching, techniques. Optionally, a release layer 337 is placed between the second layer 333b and the handle wafer 334. The release layer may be photoresist that is later easily removed by conventional solvents. Optionally, conductors may be patterned and formed on the second layer 333b, e.g. between the second layer 333b and the release layer 337 and/or the handle wafer 334.

In block 390, attach the second layer 333b to the first layer 333a, such as by reflowing the polyimide at an elevated temperature, e.g. at or above 400 C. The combination of the first layer 333a and the second layer 333b form at least one tether connecting the first substrate 322 to the second substrate 324. One or more of such tether(s) include at least one capillary 336 coupled to the reservoir that permits the fluid 331 configured to receive the fluid 331. In block 392, remove the handle wafer 334, e.g. by immersing the handle wafer and release layer 337 in solvent, e.g. acetone, to activate the release layer to release the handle wafer 334, or by at least one of grinding or etching the handle wafer.

Figure 3D:
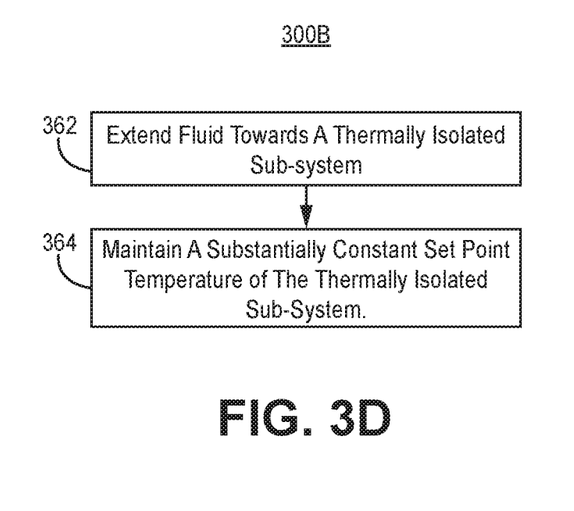
FIG. 3D illustrates an exemplary method of making a temperature stabilized physics system or a temperature stabilized electronics circuitry.

FIG. 3D illustrates an exemplary method 300B of making a temperature stabilized physics system or a temperature stabilized electronics circuitry. To the extent the method 300 shown in FIG. 3D is described herein as being implemented in the system shown in FIGS. 1-3B, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 362, upon an increase in the ambient temperature of a CSAC (e.g. of a thermally isolated system in the CSAC such as a temperature stabilized electronics circuitry and/or a temperature stabilized physics system), extend fluid away from at least one reservoir, i.e. towards or away from a thermally isolated subsystem, due to thermal expansion of the fluid because of the increased temperature. Thus, for example, the temperature increase in the ambient temperature of the reservoir increases due to an increase in ambient temperature of the temperature stabilized system of the CSAC containing the reservoir.

The temperature stabilized system comprises a non-thermally isolated subsystem and a thermally isolated subsystem. Optionally, the non-thermally isolated subsystem and the thermally isolated subsystem are respectively the first substrate 322 (and any components on or in the first substrate 322) and the second substrate 324 (and any components on or in the second substrate 324); the non-thermally isolated subsystem and a thermally isolated subsystem are thermally isolated by materials (and/or lack thereof) such as tethers and/or a vacuum.

Optionally, the fluid flows through material, e.g. in at least one capillary in tether(s) connecting the thermally isolated subsystem and the non-thermally isolated subsystem. As a result, the thermal isolation between the thermally isolated subsystem and the non-thermally isolated subsystem is reduced. Thus, more thermal energy may be transferred to the non-thermally isolated subsystem (and thus the external environment) from components, e.g. electrical circuits, on or in the thermally isolated subsystem. In block 364, maintain a substantially constant set point temperature of the thermally isolated subsystem by dissipating thermal energy from the thermally isolated subsystem to the non-thermally isolated subsystem through the fluid.

Optionally, upon a decrease in the ambient temperature of a CSAC, e.g. at a reservoir in a temperature stabilized system, withdraw the fluid towards the at least one reservoir due to thermal contraction because of the decreased temperature. Thus, less thermal energy may be transferred to the external environment from components, e.g. electrical circuits, on or in the thermally isolated subsystem; as a result a substantially constant set point temperature of the thermally isolated subsystem is maintained.

Optionally, as the ambient temperature of the CSAC varies, e.g. higher and lower, the fluid flows—as described above—through material, e.g. in at least one capillary, in tether(s) connecting the thermally isolated subsystem and the non-thermally isolated subsystem. As a result, the thermal isolation between the thermally isolated subsystem and the non-thermally isolated subsystem fluctuates with changes in ambient temperature. As a result, a substantially constant set point temperature of the thermally isolated subsystem is maintained.

Figure 4:
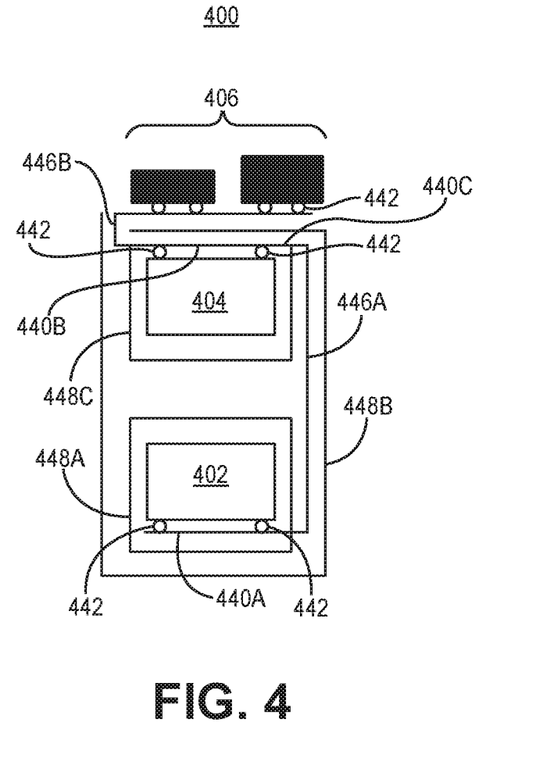
FIG. 4 illustrates a cross sectional view of one embodiment of an improved chip scale atomic clock using a vapor cell.

FIG. 4 illustrates a cross sectional view of one embodiment of an improved chip scale atomic clock using a vapor cell (improved CSAC) 400. The improved CSAC 400 includes the temperature stabilized physics system 402, the temperature stabilized electronics circuitry 404, and the non-temperature stabilized electronics circuitry 406. The temperature stabilized physics system 402 is enclosed in a first magnetic shield 448A to prevent ambient magnetic fields from entering the gas cell 102D, and to prevent the fields generated by the magnetic field coil from exiting the temperature stabilized physics system 402. The temperature stabilized physics system 402 is electrically coupled and mechanically attached, e.g. by solder balls 442, to a first CSAC substrate 440A. The temperature stabilized electronics circuitry 404 is electrically coupled and mechanically attached, e.g. by solder balls 442, to a second CSAC substrate 440B. The non-temperature stabilized electronics circuitry 406 is electrically coupled and mechanically attached, e.g. by solder balls 442, to a third CSAC substrate 440C.

Optionally, the temperature stabilized physics system 402 and the temperature stabilized electronics circuitry 404 are enclosed by a package 448B, which may be a second magnetic shield to further protect the temperature stabilized physics system 402 and the temperature stabilized electronics circuitry 404, e.g. from electromagnetic noise from the environment and the non-temperature stabilized electronics circuitry 406. The first CSAC substrate 440A and the second CSAC substrate 440B are electrically coupled by a first CSAC interconnect, such as a flexible circuit board 446A. The second CSAC substrate 440B and the third CSAC substrate 440C are electrically coupled by a third flexible circuit board 446B. The magnetic shields described herein may be made from mu-metal which is a nickel-iron soft ferromagnetic alloy with very high permeability.

Optionally, the temperature stabilized electronics circuitry 404 is separately enclosed by a third magnetic shield 448C. The temperature stabilized electronics circuitry 404 emits electromagnetic energy which may deleteriously affect the operation of the temperature stabilized physics system 402. Although, the temperature stabilized physics system 402 is enclosed by the first magnetic shield 448A, electromagnetic energy may penetrate to the temperature stabilized physics system 402, e.g. due to holes for wiring, in the first magnetic shield 448A. Thus, by enclosing the temperature stabilized electronics circuitry 404 by the third magnetic shield 448C, the temperature stabilized physics system 402 is further isolated from such electromagnetic energy.

EXEMPLARY EMBODIMENTS

Example 1 includes a chip scale atomic clock (CSAC), comprising: a temperature stabilized physics system, comprising a vapor cell and a magnetic field coil, and which is enclosed in a magnetic shield; and a temperature stabilized electronics circuitry electrically coupled to the temperature stabilized physics system.

The CSAC of Example 1, further comprising a non-temperature stabilized electronics circuitry electrically coupled to at least one of the temperature stabilized physics system and the temperature stabilized electronics circuitry.

The CSAC of Example 2, wherein the non-temperature stabilized electronics circuitry comprises at least one of controller circuitry and power conditioning circuitry.

Example 4 includes the CSAC of Example 3, wherein the non-temperature stabilized electronics circuitry further includes at least one of: a crystal oscillator, a phase locked loop, at least one heater current control circuit, and at least one coil current control circuit.

Example 5 includes the CSAC of Example 4, wherein the non-temperature stabilized electronics circuitry further includes at least one of: at least one digital to analog converter and at least one heater.

Example 6 includes the CSAC of any of Examples 1-5, wherein a second magnetic shield encloses only the temperature stabilized electronics circuitry.

Example 7 includes the CSAC of any of Examples 1-7 wherein a third magnetic shield encloses the temperature stabilized physics system and the temperature stabilized electronics circuitry.

Example 8 includes the CSAC of Example 1, wherein at least one of the temperature stabilized electronics circuitry and the temperature stabilized physics system further comprises a passive heat sink.

Example 9 includes the CSAC of Example 8, wherein the at least one of the temperature stabilized electronics circuitry and the temperature stabilized physics system comprises: a first substrate; a second substrate; components attached to the second substrate; at least one tether coupling the first substrate and the second substrate; wherein the at least one passive heat sink comprises: at least one capillary in or on at least one of the at least one tether; and at least reservoir coupled to each of the at least one capillary; wherein the at least one reservoir is configured to store liquid; wherein the at least one reservoir is mounted in or on at least one of the first substrate and the second substrate; and wherein the liquid is configured to flow through each of the at least one capillary as the ambient temperature of the CSAC fluctuates.

Example 10 includes the CSAC of Example 9, wherein the first substrate and the second substrate comprises silicon; and wherein the at least one capillary comprises a recess in a dielectric.

Example 11 includes the CSAC of any of Examples 9-10, wherein electrical conductors formed on the tether electrically couple the first substrate to the second substrate.

Example 12 includes the CSAC of any of Examples 1-11, wherein the temperature stabilized electronics circuitry comprises: a first substrate; a second substrate; at least one electrical component mounted on the second substrate; at least one tether coupled between the first substrate and the second substrate, and configured to thermally isolate the first substrate from the second substrate; a body, wherein the first substrate is attached to the body; and a lid attached to the body, wherein the first substrate, the second substrate, the at least one electrical component, and the at least one tether are enclosed in by the lid and body.

Example 13 includes the CSAC of Example 12, wherein the lid is hermetically sealed to the body; and wherein the first substrate, the second substrate, the at least one electrical component, and the at least one tether are enclosed in a vacuum by the lid and body.

Example 14 includes the CSAC of any of Examples 12-13, where the tether comprises at least one conductor that conductively couples the first substrate and the second substrate.

Example 15 includes a method, comprising: when the ambient temperature of a chip scale atomic clock (CSAC) increases, extending fluid away, due to thermal expansion, from at least one reservoir towards or away from a thermally isolated subsystem in at least one of the temperature stabilized electronics circuitry and the temperature stabilized physics system, where the CSAC comprises a temperature stabilized electronics circuitry and a temperature stabilized physics system, each of which comprises a non-thermally isolated subsystem and a thermally isolated subsystem that are thermally isolated from one another; and maintaining a substantially constant set point temperature of the thermally isolated subsystem, in the at least one of the temperature stabilized electronics circuitry and the temperature stabilized physics system, by increasing thermal energy dissipated from the thermally isolated subsystem to the non-thermally isolated subsystem through the fluid, where the substantially constant set point temperature means a temperature with in a range of temperatures that does not decrease the stability of the CSAC.

Example 16 includes the method of Example 15, wherein extending fluid away from the at least one reservoir comprises fluid flowing through at least one capillary in at least one tether, where the at least one capillary is coupled to the at least one reservoir.

Example 17 includes the method of any of Examples 15-16, further comprising: increasing an ambient temperature of the C SAC; retracting fluid, due to thermal contraction, towards the at least one reservoir away from or towards the thermally isolated subsystem; and maintaining the substantially constant set point temperature of the thermally isolated subsystem by decreasing the thermal energy dissipated from the thermally isolated subsystem to the non-thermally isolated subsystem through the fluid.

Example 18 includes a method of forming a passive heat sink in a temperature stabilized electronics circuitry or a temperature stabilized physics system of a chip scale atomic clock (CSAC), comprising: forming a first substrate with a first layer on the first substrate and second substrate with the first layer on the second substrate from a single substrate with the first layer on the single substrate; forming at least one opening in the first layer over at least one of the first substrate and the second substrate; forming a reservoir under each opening; filling each reservoir with a fluid; forming at least one recess in a second layer on a handle wafer; attaching the second layer to the first layer; and removing the handle wafer.

Example 19 includes the method of Example 18, wherein the filling each reservoir with the fluid comprises filing each reservoir with a liquid metal or a eutectic metal alloy.

Example 20 includes the method of any of Examples 18-19, wherein removing the handle wafer comprising at least one of grinding or etching the handle wafer.

While the present teachings have been illustrated with respect to one or more implementations, alterations and/or modifications can be made to the illustrated examples without departing from the scope of the appended claims. In addition, while a particular feature of the present disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B or A and/or B, means A alone, B alone, or A and B. The term "at least one of" is used to mean one or more of the listed items can be selected.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal. Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

Terms of relative position as used in this application are defined based on a plane parallel to, or in the case of the term coplanar—the same plane as, the conventional plane or working surface of a device, wafer, or substrate, regardless of orientation. The term "horizontal" or "lateral" as used in this application are defined as a plane parallel to the conventional plane or working surface of a device, wafer, or substrate, regardless of orientation. The term "vertical" refers to a direction perpendicular to the horizontal. Terms such as "on," "side" (as in "sidewall"), "higher," "lower," "over," "top," and "under" are defined with respect to the conventional plane or working surface being on the top surface of device, wafer, or substrate, regardless of orientation. The term "coplanar" as used in this application is defined as a plane in the same plane as the conventional plane or working surface of a device, wafer, or substrate, regardless of orientation.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A chip scale atomic clock (CSAC), comprising:
    a temperature stabilized physics system, comprising a vapor cell and a magnetic field coil, and which is enclosed in a magnetic shield; and
    temperature stabilized electronics circuitry electrically coupled to the temperature stabilized physics system, where the temperature stabilized electronics circuitry is configured to at least one of i) control physics system components and ii) process data sent to and/or received by the physics system components; and
    wherein when an ambient temperature of the CSAC increases, extending fluid away, due to thermal expansion, from at least one reservoir towards or away from a thermally isolated subsystem in at least one of the temperature stabilized electronics circuitry and the temperature stabilized physics system, where each of the temperature stabilized electronics circuitry and the temperature stabilized physics system comprises a non-thermally isolated subsystem and a thermally isolated subsystem that are thermally isolated from one another.

2. The CSAC of claim 1, further comprising a non-temperature stabilized electronics circuitry electrically coupled to at least one of the temperature stabilized physics system and the temperature stabilized electronics circuitry.

3. The CSAC of claim 2, wherein the non-temperature stabilized electronics circuitry comprises at least one of controller circuitry and power conditioning circuitry.

4. The CSAC of claim 3, wherein the non-temperature stabilized electronics circuitry further includes at least one of: a crystal oscillator, a phase locked loop, at least one heater current control circuit, and at least one coil current control circuit.

5. The CSAC of claim 1, wherein a substantially constant set point temperature of the thermally isolated subsystem is maintained, in the at least one of the temperature stabilized electronics circuitry and the temperature stabilized physics system, by increasing thermal energy dissipated from the thermally isolated subsystem to the non-thermally isolated subsystem through the fluid, where the substantially constant set point temperature means a temperature within a range of temperatures that does not decrease the stability of the CSAC.

6. The CSAC of claim 1, wherein a second magnetic shield encloses only the temperature stabilized electronics circuitry.

7. The CSAC of claim 1 wherein a third magnetic shield encloses the temperature stabilized physics system and the temperature stabilized electronics circuitry.

8. The CSAC of claim 1, wherein at least one of the temperature stabilized electronics circuitry and the temperature stabilized physics system further comprises a passive heat sink.

9. The CSAC of claim 8, wherein the at least one of the temperature stabilized electronics circuitry and the temperature stabilized physics system comprises:
   a first substrate;
   a second substrate;
   components attached to the second substrate;
   at least one tether coupling the first substrate and the second substrate;
   wherein the at least one passive heat sink comprises:
      at least one capillary in or on at least one of the at least one tether; and
      at least reservoir coupled to each of the at least one capillary;
   wherein the at least one reservoir is configured to store liquid;
   wherein the at least one reservoir is mounted in or on at least one of the first substrate and the second substrate; and
   wherein the liquid is configured to flow through each of the at least one capillary as the ambient temperature of the CSAC fluctuates.

10. The CSAC of claim 9, wherein the first substrate and the second substrate comprises silicon; and
   wherein the at least one capillary comprises a recess in a dielectric.

11. The CSAC of claim 9, wherein electrical conductors formed on the tether electrically couple the first substrate to the second substrate.

12. The CSAC of claim 1, wherein the temperature stabilized electronics circuitry comprises:
   a first substrate;
   a second substrate;
   at least one electrical component mounted on the second substrate;
   at least one tether coupled between the first substrate and the second substrate, and configured to thermally isolate the first substrate from the second substrate;
   a body, wherein the first substrate is attached to the body; and
   a lid attached to the body, wherein the first substrate, the second substrate, the at least one electrical component, and the at least one tether are enclosed in by the lid and body.

13. The CSAC of claim 12, wherein the lid is hermetically sealed to the body; and
   wherein the first substrate, the second substrate, the at least one electrical component, and the at least one tether are enclosed in a vacuum by the lid and body.

14. The CSAC of claim 12, where the tether comprises at least one conductor that conductively couples the first substrate and the second substrate.

15. A method, comprising:
   when the ambient temperature of a chip scale atomic clock (C SAC) increases, extending fluid away, due to thermal expansion, from at least one reservoir towards or away from a thermally isolated subsystem in at least one of the temperature stabilized electronics circuitry and the temperature stabilized physics system, where the CSAC comprises a temperature stabilized electronics circuitry and a temperature stabilized physics system, each of which comprises a non-thermally isolated subsystem and a thermally isolated subsystem that are thermally isolated from one another; and
   maintaining a substantially constant set point temperature of the thermally isolated subsystem, in the at least one of the temperature stabilized electronics circuitry and the temperature stabilized physics system, by increasing thermal energy dissipated from the thermally isolated subsystem to the non-thermally isolated subsystem through the fluid, where the substantially constant set point temperature means a temperature with in a range of temperatures that does not decrease the stability of the CSAC.

16. The method of claim 15, wherein extending fluid away from the at least one reservoir comprises fluid flowing through at least one capillary in at least one tether, where the at least one capillary is coupled to the at least one reservoir.

17. The method of claim 15, further comprising:
   increasing an ambient temperature of the CSAC;
   retracting fluid, due to thermal contraction, towards the at least one reservoir away from or towards the thermally isolated subsystem; and
   maintaining the substantially constant set point temperature of the thermally isolated subsystem by decreasing the thermal energy dissipated from the thermally isolated subsystem to the non-thermally isolated subsystem through the fluid.

18. A method of forming a passive heat sink in a temperature stabilized electronics circuitry or a temperature stabilized physics system of a chip scale atomic clock (CSAC), comprising:
   forming a first substrate with a first layer on the first substrate and second substrate with the first layer on the second substrate from a single substrate with the first layer on the single substrate;
   forming at least one opening in the first layer over at least one of the first substrate and the second substrate;
   forming a reservoir under each opening;
   filling each reservoir with a fluid;
   forming at least one recess in a second layer on a handle wafer;
   attaching the second layer to the first layer; and
   removing the handle wafer.

19. The method of claim 18, wherein the filling each reservoir with the fluid comprises filing each reservoir with a liquid metal or a eutectic metal alloy.

20. The method of claim 18, wherein removing the handle wafer comprising at least one of grinding or etching the handle wafer.

* * * * *